(12) United States Patent
Cheng

(10) Patent No.: US 7,499,120 B2
(45) Date of Patent: Mar. 3, 2009

(54) LIQUID CRYSTAL DISPLAY PIXEL STRUCTURE AND METHOD FOR MANUFACTURING THE SAME

(75) Inventor: Yi-Sheng Cheng, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 178 days.

(21) Appl. No.: 11/748,538

(22) Filed: May 15, 2007

(65) Prior Publication Data
US 2008/0055503 A1    Mar. 6, 2008

(30) Foreign Application Priority Data
Sep. 1, 2006   (TW) .............................. 95132479 A

(51) Int. Cl.
*G02F 1/136*    (2006.01)
(52) U.S. Cl. ....................................................... 349/43
(58) Field of Classification Search .................... 349/43
See application file for complete search history.

(56) References Cited

U.S. PATENT DOCUMENTS

2005/0133791 A1   6/2005  Yang
2005/0140877 A1   6/2005  Jeoung et al.

*Primary Examiner*—David Nelms
*Assistant Examiner*—Phu Vu
(74) *Attorney, Agent, or Firm*—Thomas, Kayden, Horstemeyer & Risley

(57) ABSTRACT

A liquid crystal display pixel structure and a method for manufacturing the structure are provided. An additional conductive layer (i.e. a third conductive layer) is provided to electrically connect a second patterned conductive layer, a control device, and a capacitance device at a control area and a capacitance area of the substrate. A half-tone mask is utilized in the manufacturing processes to simultaneously define the patterns of the third conductive layer and a transparent conductive layer. Thus, the photolithography processes can be economized to reduce manufacturing costs while increasing capacity.

16 Claims, 11 Drawing Sheets

US 7,499,120 B2

LIQUID CRYSTAL DISPLAY PIXEL STRUCTURE AND METHOD FOR MANUFACTURING THE SAME

This application claims priority to Taiwan Patent Application No. 095132479 filed on Sep. 1, 2006, the disclosures of which are are incorporated herein by reference in their entirety.

BACKGROUND OF THE INVENTION

1. Field of the Invention

The present invention relates to an LCD pixel structure and a method for manufacturing the structure. In particular, the invention relates to an LTPS-LCD pixel structure and a method for manufacturing the structure.

2. Descriptions of the Related Art

Liquid crystal displays (LCDs) are mainstream products on the display market. Not only do LCDs save power and emit low radiation, they are also lightweight and portable. Technologies of thin-film-transistor LCD (TFT-LCD) can be classified into two groups: amorphous silicon (α-Si) and poly-silicon (Poly-Si).

However, low temperature poly silicon (LTPS) is a recent and novel technology for manufacturing Poly-Si LCDs. In comparison with conventional α-Si LCDs, the displays which utilize LTPS technology have higher performance, with shorter response time and greater brightness, resolution, and color saturation. Therefore, LTPS-LCDs can present images with higher display quality. Moreover, the TFT module in the LTPS-LCDs can be minimized and thus the LTPS-LCDs can be thinner and lighter in order to reduce power exhausting. The smaller size advantage of the TFT modules and the LTPS-LCDs also reduces manufacturing costs as well. Because of the many advantages presented by LTPS technology, LTPS-LCDs attract a large portion of the LCD market.

In the conventional LTPS photolithography manufacturing processes, six masks are usually involved. These processes for manufacturing an LPTS-LCD pixel structure 10 are outlined in FIGS. 1A to 1F. For illustration, a TFT 11 and a capacitance storage device 13 are merely shown in the figures. Firstly, FIG. 1A shows the photolithography process with the first mask. Poly-silicon islands 110, 130 are formed onto a substrate 100 to function as fundamental materials for the TFT 11 and the capacitance storage device 13.

Referring to FIG. 1B, the photolithography process with the second mask is illustrated. A lower dielectric layer 12 is formed to cover the aforesaid poly-silicon islands 110, 130. Then, the first conductive layers 113, 133 are respectively formed on the lower dielectric layer 12. Subsequently, as shown the arrows in FIG. 1B, the poly-silicon islands 110 are doped with P+ and P− ions to turn the islands into a source/drain structure.

After, as shown in FIG. 1C, an upper insulator layer 14 covers the aforesaid structures. Two contact holes 141 are then formed by the photolithography process with the third mask. The contact holes 141 are then utilized to expose the source/drain structure for electrical conduction.

The photolithography process with the fourth mask is shown in FIG. 1D. The second conductive layers 115, 135 are formed, in which the second conductive layer 115 connects the source/drain structure within the contact hole 141. The other second conductive layer 135 is correspondingly formed above the first conductive layer 133. As a result, a MIM (metal-insulator-metal) capacitance is formed between the first conductive layer 133 and the second conductive layer 135.

Referring to FIG. 1E, a passivation layer 16 is formed to cover the above mentioned elements. Then, the photolithography process with the fifth mask can be proceeded to form a contact hole 161 for partially exposing the second conductive layer 115 which connects with the drain structure.

Finally, as shown in FIG. 1F, a transparent conductive layer 17 is formed by the photolithography process with the sixth mask. The transparent conductive layer 17 electrically connects with the second conductive layer 115 at the contact hole 161 and further connects to a display area (not shown) of the pixel for providing the required electric fields.

As previously mentioned, at least six masks are involved in the manufacturing of the conventional LTPS-LCD pixel structure 10. Because of the high cost associated with each photolithography process, a manufacturing method with a large number of photolithography processes will result in a higher overall manufacturing cost.

Given the above, an LTPS-LCD pixel structure and a method for manufacturing the structure using less photolithography processes with similar or even more preferable functions need to be developed in this field.

SUMMARY OF THE INVENTION

The primary objective of this invention is to provide an LCD pixel structure. Unlike the disposition of the conventional LTPS-LCD pixel structure, the second patterned conductive layer of the present invention electrically connects the source/drain structures through a third conductive layer. This invention can provide flexibility in manufacturing and a better conductive medium for the structure, thus economizing the manufacturing processes and simultaneously improving the display performance.

Another objective of this invention is to provide a method for manufacturing the pixel structure of LCD. As compared with the conventional structure, the method of the present invention can simultaneously define the contact holes and the transparent conductive layer in single photolithography process. Then, a half-tone mask process is performed to expose the transparent conductive layer onto the display area. Thus, at least one photolithography process can be economized to effectively reduce the manufacturing costs.

To achieve the aforementioned objectives, the present invention discloses a method for manufacturing an LCD pixel structure on a substrate. This substrate has a plurality of pixel areas in which each of the pixel areas includes a control area, a capacitance area, and a display area. The method comprises the following steps of: forming a patterned poly-silicon layer on the control area and the capacitance area of the substrate; forming a lower dielectric layer, which covers the control area and the capacitance area of the substrate; forming a first patterned conductive layer on the lower dielectric layer above the patterned poly-silicon layer on the control area and the capacitance area, whereby forming a control device on the control area; forming an upper dielectric layer on the substrate which covers the first patterned conductive layer; forming a second patterned conductive layer on the control area and the capacitance area, whereby forming a capacitance device on the capacitance area; forming a patterned planarization dielectric layer and a patterned transparent conductive layer to cover at least the control device and the capacitance device, in which at least part of the second patterned conductive layer is exposed; forming a third conductive layer which electrically connects the second patterned conductive layer, the control device, and the capacitance device; and finally, patterning the third conductive layer and the transparent conductive layer with desired configuration.

By the abovementioned method, the LCD pixel structure of the present invention is formed. The LCD pixel structure comprises the control device and the capacitance device, wherein the first patterned conductive layer is partially formed on the lower dielectric layer to correspond to the control area and the capacitance area. On the capacitance area, the second patterned conductive layer and the first patterned conductive layer form the capacitance device therebetween. The third conductive layer electrically connects with the second patterned conductive layer, the control device, the patterned poly-silicon layer, and the transparent conductive layer.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 4:
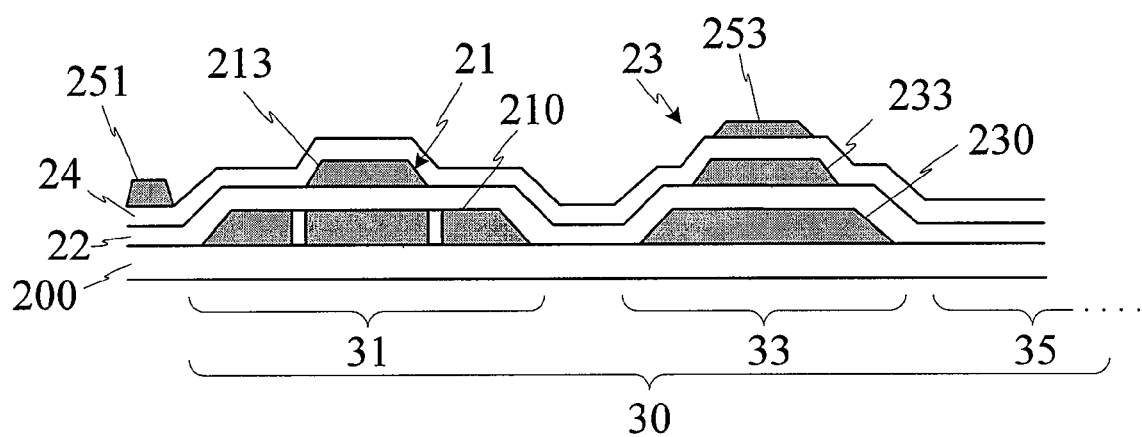
FIG. 4 is a schematic cross-sectional view illustrating the photolithography process with the third mask of the preferred embodiment of the present invention.
Figure 5:
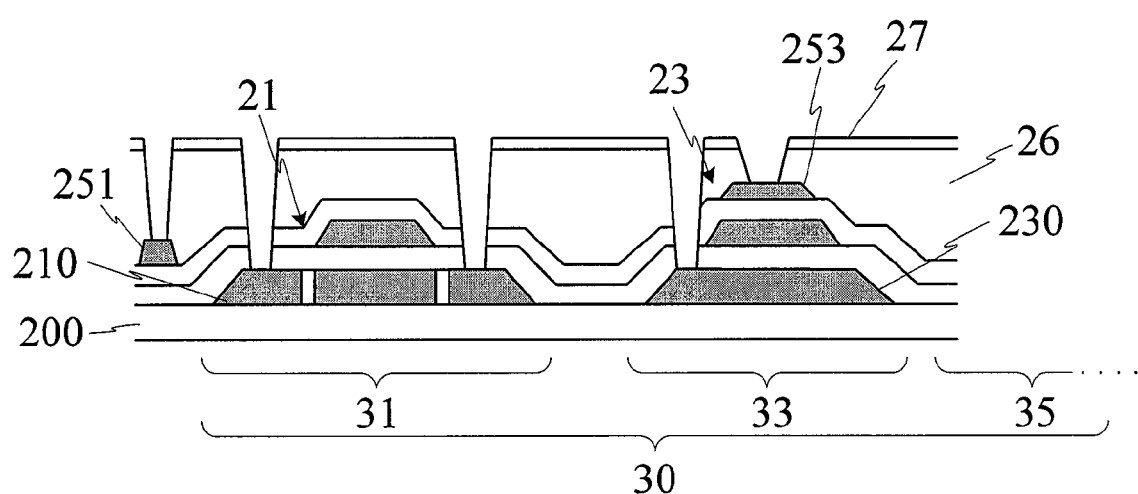
FIG. 5 is a schematic cross-sectional view illustrating the photolithography process with the fourth mask of the preferred embodiment of the present invention.
Figure 6A:
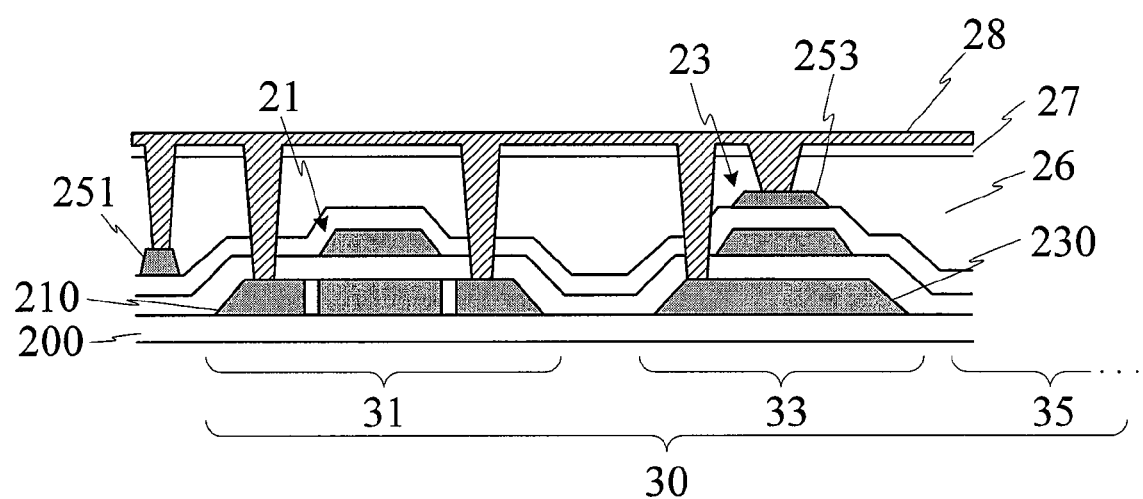
FIGS. 6A, 6B, and 6C are schematic cross-sectional views illustrating the photolithography process with the fifth mask of the preferred embodiment of the present invention.
Figure 6B:
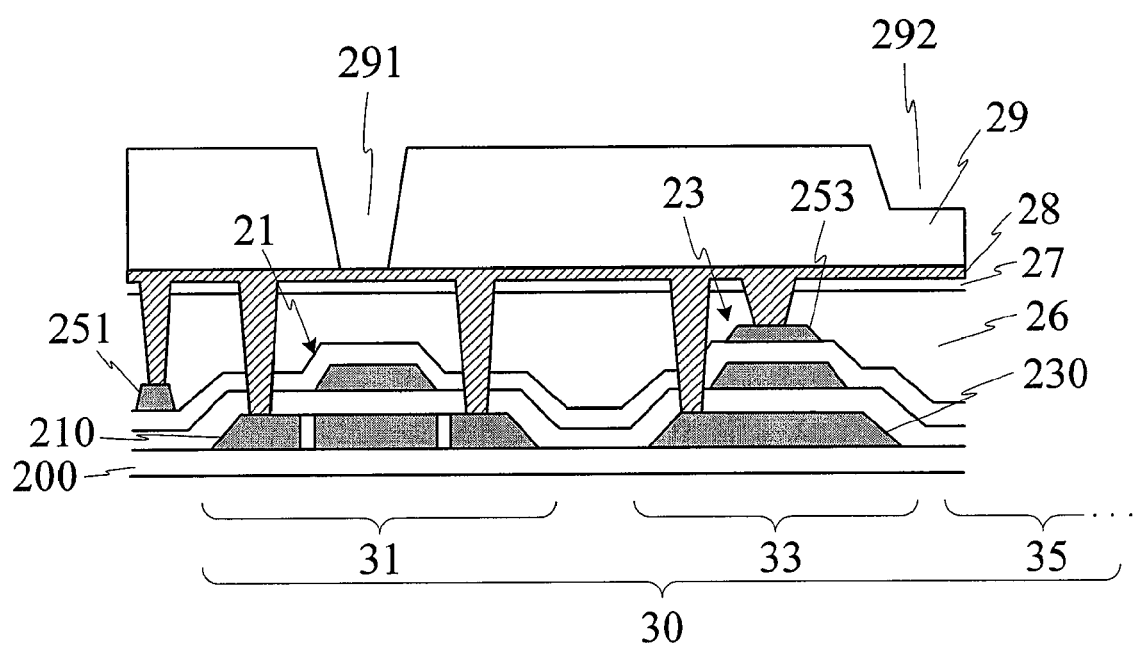
Figure 6C:
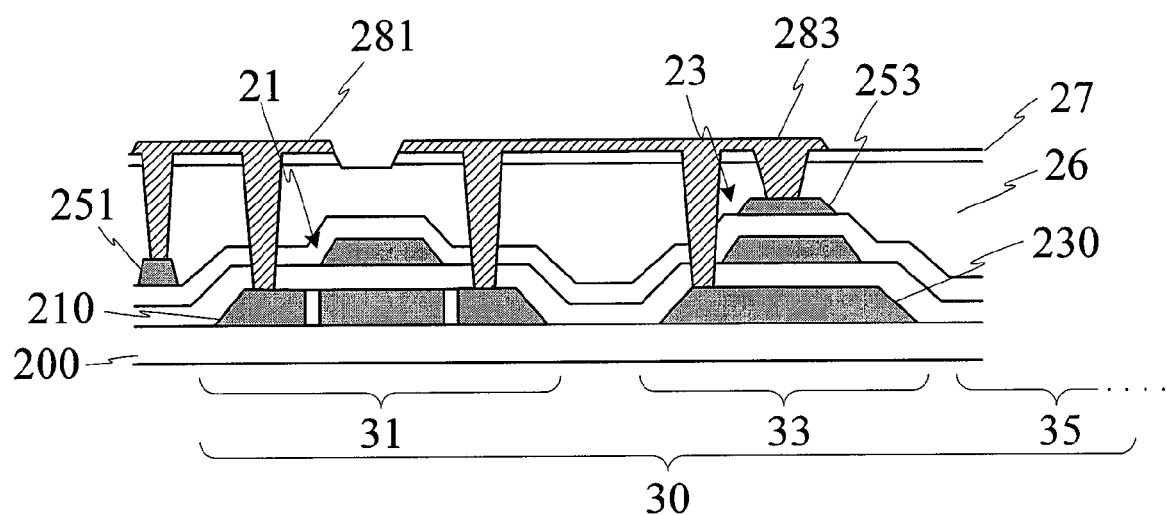

A preferred embodiment of the liquid crystal display pixel structure of the present invention is shown in FIG. 6C, and preferred manufacturing processes of the structure are shown in FIGS. 2 to 6C.

Figure 1A:
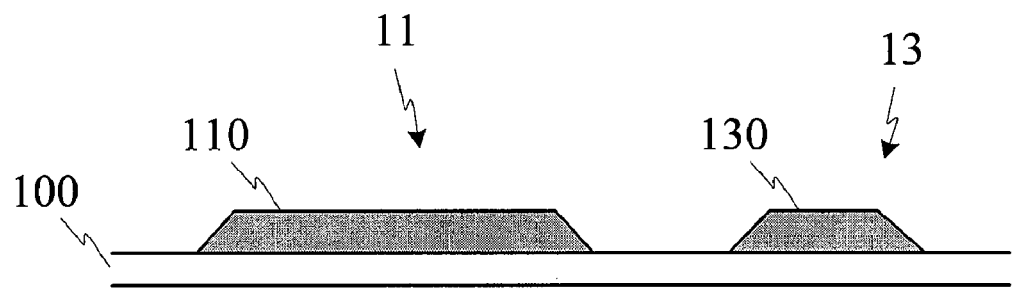
FIGS. 1A to 1F are schematic cross-sectional views illustrating the manufacturing processes of the conventional LCD pixel structure.
Figure 1B:
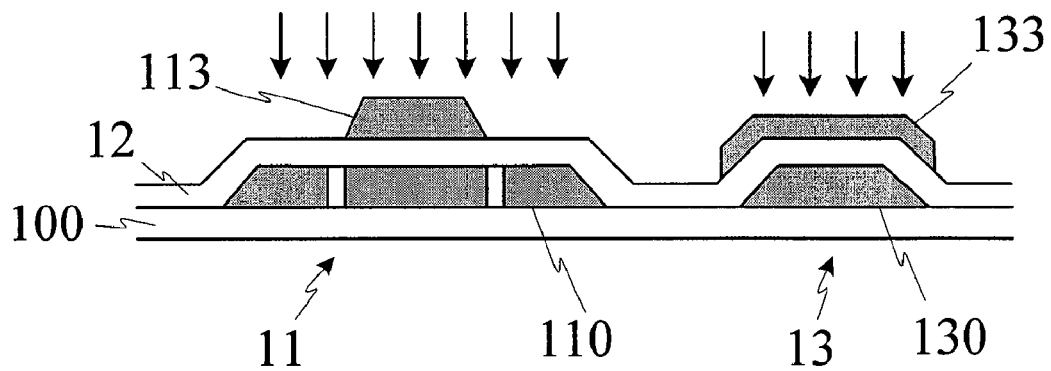
Figure 1C:
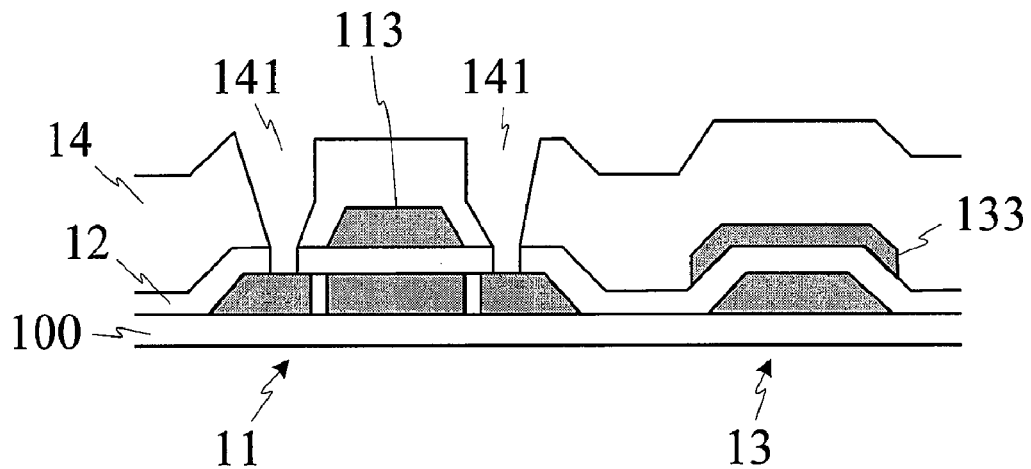
Figure 1D:
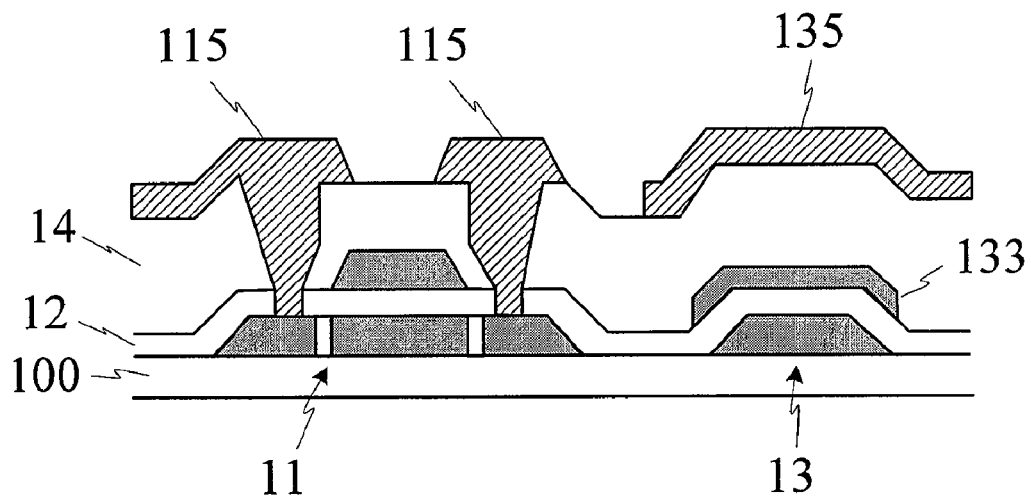
Figure 1E:
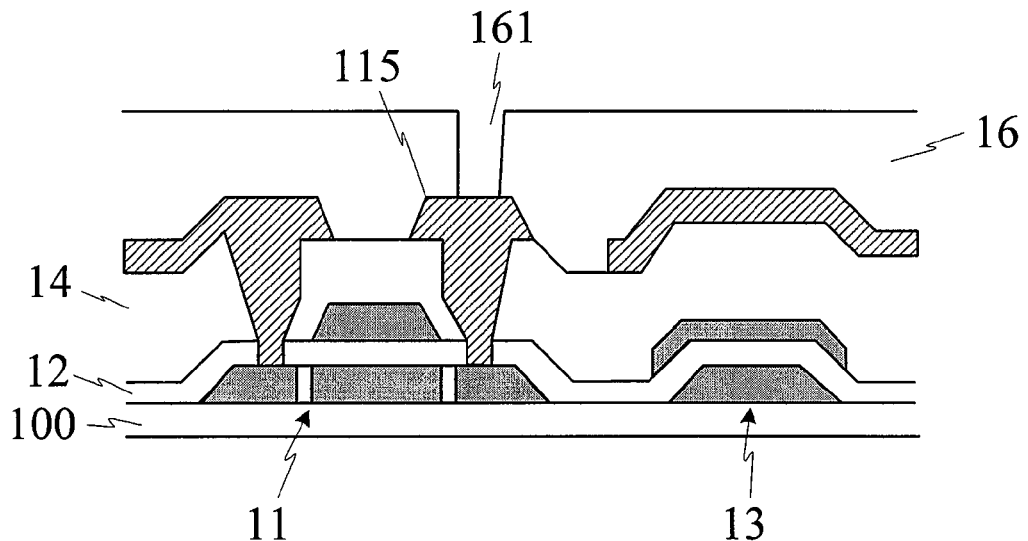
Figure 1F:
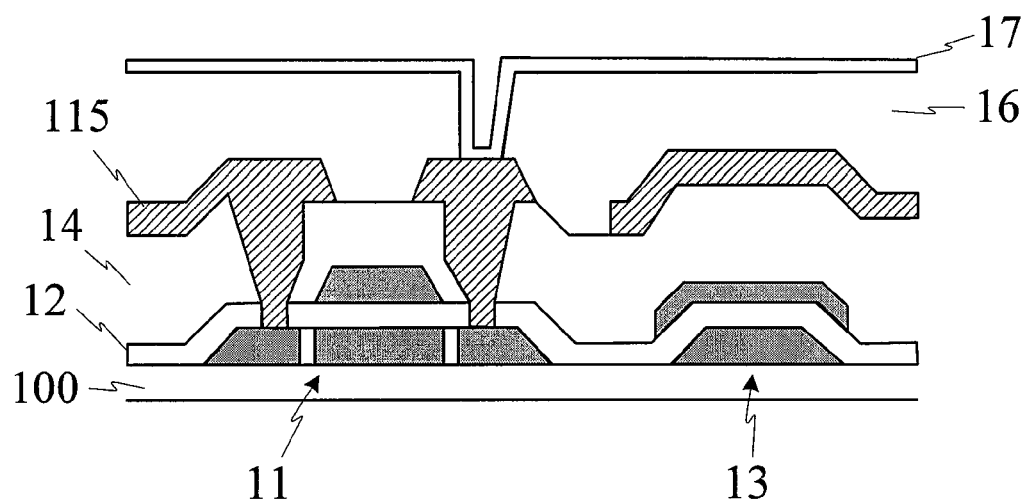
Figure 2:
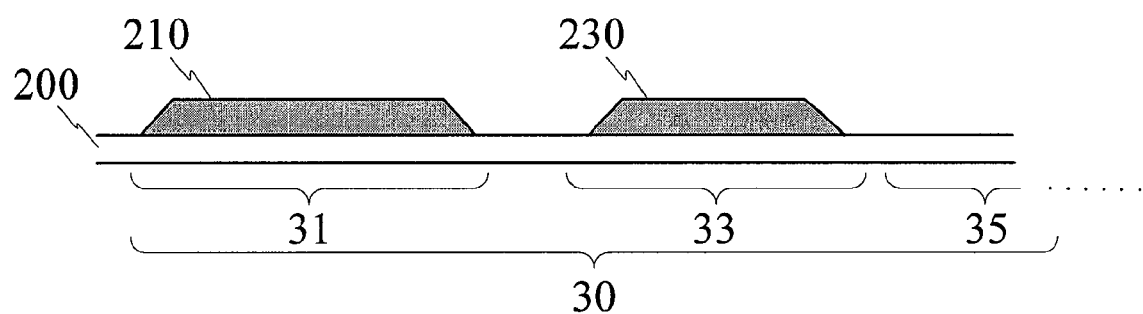
FIG. 2 is a schematic cross-sectional view illustrating the photolithography process with the first mask of the preferred embodiment of the present invention.

With reference to FIG. 2, the LCD pixel structure 20 of the present invention comprises a substrate 200 having a plurality of pixel areas 30. Each of these pixel areas 30 includes a control area 31, a capacitance area 33, and a display area 35. Firstly, a poly-silicon layer is formed on the control area 31 and the capacitance area 33 of the substrate 200. More specifically, the poly-silicon layer is formed into a patterned poly-silicon layer 210, 230 on the control area 31 and the capacitance area 33 by the photolithography process with the first mask.

Figure 3:
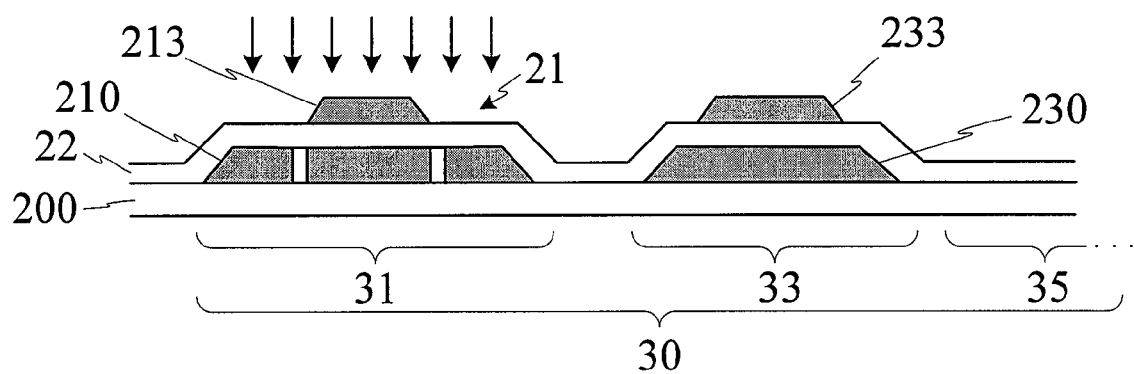
FIG. 3 is a schematic cross-sectional view illustrating the photolithography process with the second mask of the preferred embodiment of the present invention.

As shown in FIG. 3, a lower dielectric layer 22 is formed to cover the aforementioned patterned poly-silicon layer 210, 230, or in other words, the control area 31 and the capacitance area 33 of the substrate 200. The lower dielectric layer 22 preferably comprises a silicon oxide dielectric layer. The photolithography process with the second mask is then performed. Thus, a first patterned conductive layer 213, 233 is formed on the lower dielectric layer 22 to correspond to the control area 31 and the capacitance area 33. Then, P+ (heavily doped positive) and P− (lightly doped positive) ions can be doped into the patterned poly-silicon layer 210 to form a source electrode and a drain electrode therein. The patterned poly-silicon layer 210 can then be further doped to form an LDD (lightly doped drain) structure by slightly etching the first patterned conductive layer 213, 233 before this doping process. After the aforementioned processes, a control device 21 is preliminarily formed on the control area 31. Preferably, the control device 21 comprises a thin-film-transistor (TFT).

After, an upper dielectric layer 24 is formed to cover the aforesaid structure as shown in FIG. 4. The upper dielectric layer 24 at least covers the first patterned conductive layer 233 disposed on the capacitance area 33 and also at least covers the first patterned conductive layer 213 disposed on the control area 31. By the photolithography and etching processes with the third mask, a second patterned conductive layer 251, 253 is formed on the upper dielectric layer 24 on the control area 31 and the capacitance area 33. A part of the second patterned conductive layer 251 serves as the data line. Thereby, a capacitance device 23 is formed on the capacitance area 33 by the first patterned conductive layer 233 and the second patterned conductive layer 253.

Subsequently, as shown in FIG. 5, a planarization dielectric layer 26 and a transparent conductive layer 27 are formed on the control area 31, the capacitance area 33, and the display area 35 of the substrate. The planarization dielectric layer 26 and the transparent conductive layer 27 at least cover the second patterned conductive layer 251, 253, i.e. the control device 21 and the capacitance device 23. The transparent conductive layer 27 and the planarization dielectric layer 26 are further formed on the display area 35. In particular, the planarization dielectric layer 26 can be made from nitrides, oxides, or organic materials. The material of the transparent conductive layer 27 preferably comprises Indium Tin Oxide (ITO). These materials can be appropriately substituted by those skilled in this field and are not limited herein. The photolithography process with the fourth mask is then performed and the planarization dielectric layer 26 and the transparent conductive layer 27 are patterned to expose at least one of the second patterned conductive layer 251, 253.

More particularly, for the following electrical connection, the planarization dielectric layer 26 and the transparent conductive layer 27 are also patterned to expose the source/drain electrodes on the control area 31 and the patterned poly-silicon layer 230 on the capacitance area 33. This photolithography process is characterized by simultaneously patterning the planarization dielectric layer 26 and the transparent conductive layer 27 by one mask to form the contact holes for partially exposing the abovementioned structure.

Finally, referring to FIG. 6A, an additional conductive layer (i.e. the third conductive layer 28, correspondingly) is formed on the transparent conductive layer 27 to cover the aforementioned structures and fill into the contact holes. The additional conductive layer electrically connects the second patterned conductive layer 251, 253, the control device 21, and the patterned poly-silicon layer 230 through the contact holes as shown in FIG. 5. That is to say, the third conductive layer 28 electrically connects the second patterned conductive layer 251, 253, and the patterned poly-silicon layer 210, 230 on the control device 21 and the capacitance area 33. At the same time, the third conductive layer 28 also electrically connects with the transparent conductive layer 27.

Next, the third conductive layer 28 and the transparent conductive layer 27 are simultaneously patterned with desired configuration by performing the photolithography process with the fifth mask of the present invention. As shown in FIG. 6B, a photo-resistance layer 29 is formed on the control area 31, the capacitance area 33, and the display area 35. Preferably, a half-tone mask process is adopted to form the photo-resistance layer 29. Thus, a first recess 291 having a greater depth and a second recess 292 having a shallower depth are partially formed in the photo-resistance layer 29. Subsequently, an etching process with the photo-resistance layer 29 as a mask is performed. Due to the photo-resistance layer 29 formed by the half-tone mask having desired thicknesses on different locations, the desired configuration can be formed after the etching process, as shown in FIG. 6C. In other words, the third conductive layer 28 and the transparent conductive layer 27 which corresponds to the first recess 291 are removed, and the transparent conductive layer 27 which corresponds to the second recess 292 can be left behind when the third conductive layer 28 is removed under the same etching condition. More specifically, the third conductive layer 281 connects the second patterned conductive layer 251 and the source electrode of the control device 21. Additionally, the third conductive layer 283 connects the second patterned conductive layer 253 of the capacitance device 23, the drain electrode of the control device 21, and partial patterned poly-silicon layer 230. Simultaneously, the transparent conductive layer 27 remains with the desired configuration on the display area 35 as a pixel electrode.

Figure 7:
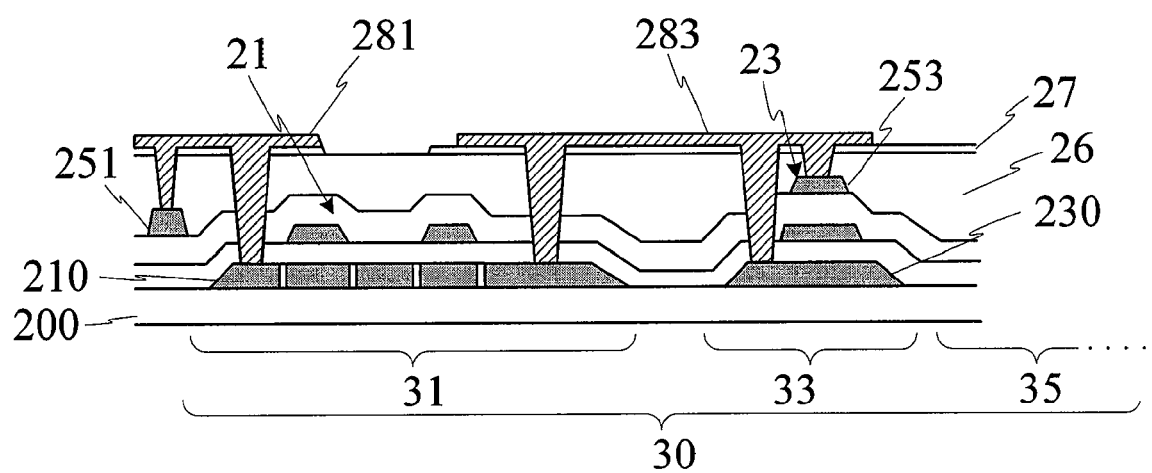
FIG. 7 is a schematic cross-sectional view illustrating an LCD pixel structure with double gates of the present invention.

The LCD pixel structure 20 of the present invention can be obtained after the manufacturing method is performed. The LCD pixel structure 20 comprises the control device 21 and the capacitance device 23 respectively corresponding to the control area 31 and the capacitance area 33. For the convenience of disclosing the present invention, the LCD pixel structure 20 having a single-gate (the first patterned conductive layer 213) is described, as shown in FIG. 6C. In practice, the cross-sectional view of the LCD pixel structure 20 will be different according to the different cross-hatching lines. FIG. 7 illustrates another embodiment of the LCD pixel structure 20 with a double-gate.

According to the abovementioned disclosures, the method for manufacturing the LCD pixel structure 20 economizes the photolithography processes from six into five. Not only does this simplify the manufacturing process, but the reduced number of steps also reduces the cost of the masks and thus effectively reduces the costs of manufacturing. The third conductive layer can further enhance the electric field of the whole structure.

The above disclosure is related to the detailed technical contents and inventive features thereof. Those skilled in this field may proceed with a variety of modifications and replacements based on the disclosures and suggestions of the invention as described without departing from the characteristics thereof. Although such modifications and replacements are not fully disclosed in the above descriptions, they have substantially been covered in the following claims as appended.

What is claimed is:

1. A method for manufacturing a pixel structure of a liquid crystal display, the pixel structure comprising a substrate having a control area, a capacitance area, and a display area, the method comprising the steps of:
   (a) forming a patterned poly-silicon layer on the control area and the capacitance area of the substrate;
   (b) forming a lower dielectric layer covering the control area and the capacitance area of the substrate, and a first patterned conductive layer on the lower dielectric layer above the patterned poly-silicon layer on the control area and the capacitance area, to form a control device on the control area;
   (c) forming an upper dielectric layer covering the first patterned conductive layer disposed on the capacitance area of the substrate, and a second patterned conductive layer on the control area and the capacitance area, to form a capacitance device on the capacitance area;
   (d) forming a patterned planarization dielectric layer and a patterned transparent conductive layer on the control area, the capacitance area, and the display area, to cover the control device and the capacitance device, and to expose at least part of the second patterned conductive layer, the control device, and the capacitance device;
   (e) forming a third conductive layer on the transparent conductive layer, to electrically connect the exposed second patterned conductive layer, the control device, and the capacitance device; and
   (f) patterning the third conductive layer and the transparent conductive layer, wherein the third conductive layer electrically connects the second patterned conductive layer, the control device, and the capacitance device.

2. The method as claimed in claim 1, wherein the step (b) further comprises the following steps:
   (b-1) doping the control device, to form a source electrode and a drain electrode on the control device; and
   (b-2) doping the control device further, to form an LDD structure on the control device.

3. The method as claimed in claim 1, wherein the step (c) further comprises the following step:
   (c-1) making the upper dielectric layer at least partially covering the first patterned conductive layer on the control area.

4. The method as claimed in claim 1, wherein the steps (d) and (e) further comprises the following steps:
   (d-1) forming at least one exposure area on the patterned poly-silicon layer on the control area and the capacitance area; and
   (e-1) electrically connecting the exposed second patterned conductive layer, and the exposure areas of the patterned poly-silicon layer on the control device and the capacitance area by connecting the third conductive layer thereamong.

5. The method as claimed in claim 1, wherein the lower dielectric layer comprises a silicon oxide dielectric layer.

6. The method as claimed in claim 1, wherein the step (f) further comprises the step of:
   (f-1) forming a photo-resistance layer to correspond to the control area, the capacitance area, and the display area, and subsequently proceeding with an etching process.

7. The method as claimed in claim 6, wherein the step (f-1) performs a half-tone mask process to form the photo-resistance layer, whereby the third conductive layer partially remains to connect the second patterned conductive layer, the control device, and the capacitance device, and simultaneously forms the transparent conductive layer with the desired configuration on the display area after the etching process.

8. A pixel structure of a liquid crystal display, comprising:
   a substrate having a plurality of pixel areas in which each of the pixel areas includes a control area, a capacitance area, and a display area;
   a control device formed on the substrate corresponding to the control area;
   a patterned poly-silicon layer formed on the substrate corresponding to the capacitance area;
   a lower dielectric layer formed on the patterned poly-silicon layer;

a first patterned conductive layer partially formed on the lower dielectric layer corresponding to the capacitance area;

an upper dielectric layer covering the control device and the first patterned conductive layer, a second patterned conductive layer at least partially covering the upper dielectric layer corresponding to the capacitance area to form a capacitance device with the first patterned conductive layer;

a planarization dielectric layer covering the second patterned conductive layer;

a transparent conductive layer at least partially formed on the planarization dielectric layer corresponding to the display area; and a third patterned conductive layer, electrically connecting the second patterned conductive layer to the control device, and the patterned poly-silicon layer and the transparent conductive layer to the control device, respectively.

9. The pixel structure as claimed in claim 8, wherein the control device comprises a thin-film-transistor (TFT).

10. The pixel structure as claimed in claim 8, wherein a material of the transparent conductive layer comprises Indium Tin Oxide (ITO).

11. The pixel structure as claimed in claim 8, wherein the lower dielectric layer comprises a silicon oxide dielectric layer.

12. A method for manufacturing a pixel structure of a liquid crystal display, the pixel structure comprising a substrate having a plurality of pixel areas in which each of the pixel areas includes a control area, a capacitance area, and a display area, the method comprising the steps of:

forming a control device on the control area and a capacitance device on the capacitance area, respectively;

forming a planarization dielectric layer and a transparent conductive layer sequentially, to cover the control device and the capacitance device on the control area, the capacitance area, and the display area, in which at least one exposure area is formed on each of the control area and the capacitance area;

forming a conductive layer on the planarization dielectric layer and electrically connecting the control device and the capacitance device through the exposure areas; and patterning the conductive layer and the transparent conductive layer with desired configuration.

13. The method as claimed in claim 12, wherein the control device comprises a thin-film-transistor (TFT).

14. The method as claimed in claim 12, wherein the step of forming the control device and the capacitance device further comprises the following steps:

forming a patterned poly-silicon layer on the control area and the capacitance area of the substrate;

forming a lower dielectric layer covering the control area and the capacitance area of the substrate, and partially forming a first patterned conductive layer on the lower dielectric layer corresponding to the control area and the capacitance area, to form the control device on the control area; and forming an upper dielectric layer covering the first patterned conductive layer on the capacitance area, and forming a second patterned conductive layer on the control area and the capacitance area, to form the capacitance device on the capacitance area.

15. The method as claimed in claim 14, wherein the step of forming the at least one exposure area on the control area and the capacitance area further comprising the step of:

forming the at least one exposure area on the patterned poly-silicon layer on the control area and the capacitance area respectively.

16. The method as claimed in claim 14, wherein the step of patterning the conductive layer and the transparent conductive layer with desired configuration comprises:

performing a half-tone mask process to form a photo-resistance layer; and etching the conductive layer and the transparent conductive layer with the photo-resistance layer as a mask, whereby the conductive layer connected to the second patterned conductive layer, the control device, and the capacitance device is adapted to be partially presented and the transparent conductive layer is simultaneously formed with the desired configuration on the display area.

* * * * *